United States Patent [19]

Funahashi

[11] 4,245,164
[45] Jan. 13, 1981

[54] SOLID STATE IMAGE PICKUP DEVICE

[75] Inventor: Kohei Funahashi, Yokohama, Japan

[73] Assignee: Tokyo Shibaura Electric Co., Ltd., Kawasaki, Japan

[21] Appl. No.: 937,184

[22] Filed: Aug. 28, 1978

Related U.S. Application Data

[63] Continuation of Ser. No. 753,858, Dec. 23, 1976, abandoned.

[30] Foreign Application Priority Data

Dec. 25, 1975 [JP] Japan .................... 50-156935

[51] Int. Cl.³ .............. G11C 19/28; H01L 29/78; H01L 27/14; H01L 31/00
[52] U.S. Cl. .................... 307/221 D; 357/24; 357/30; 307/311
[58] Field of Search ............. 357/24, 30; 307/221 D; 250/211 J

[56] References Cited

U.S. PATENT DOCUMENTS

| 3,654,499 | 4/1972 | Smith | 357/24 |
|---|---|---|---|
| 3,777,061 | 12/1973 | Takemura | 357/24 |
| 3,931,463 | 1/1976 | Levine | 357/24 |
| 3,995,260 | 11/1976 | Chan | 357/24 |
| 4,010,319 | 3/1977 | Levine | 357/24 |
| 4,032,976 | 6/1977 | Levine | 357/24 |

OTHER PUBLICATIONS

Sequin "Interlacing in Charge-Coupled Imaging Devices", IEEE Trans. Electron Devices, vol. ed-20 (6/73), pp. 534-541.

Primary Examiner—Gene M. Munson
Attorney, Agent, or Firm—Cushman, Darby & Cushman

[57] ABSTRACT

A solid state image pickup device utilizing a charge coupled device (CCD) includes an imaging section for converting a projected optical image into an electric charge corresponding to a quantity of light, a storage section for storing the electric charge transferred from the imaging section, a readout section for delivering as a video output signal the electric charge sequentially transferred from the storage section, a drive means for transferring the electric charge, and an erasing section for erasing an unrequired portion of the electric charge. The erasing section is an erasing drain formed by diffusion on a P-type semiconductor substrate of CCD and includes an erasing electrode connected to the erasing drain.

4 Claims, 15 Drawing Figures

F I G. 2
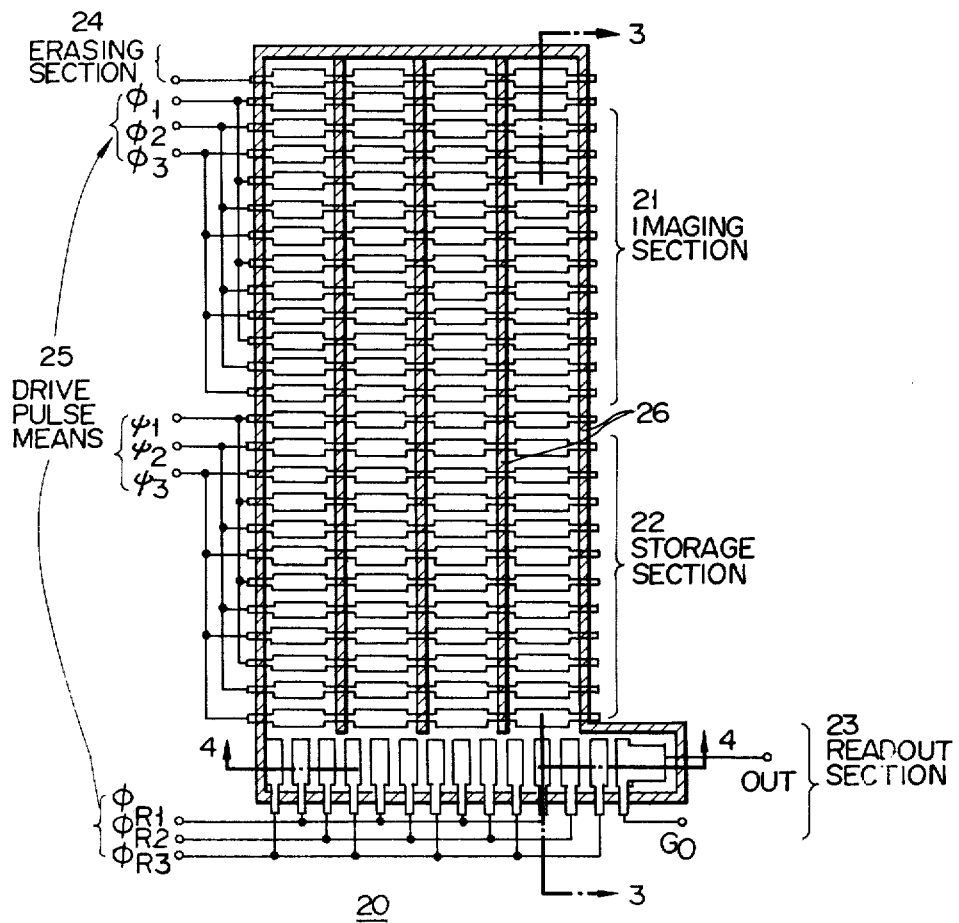

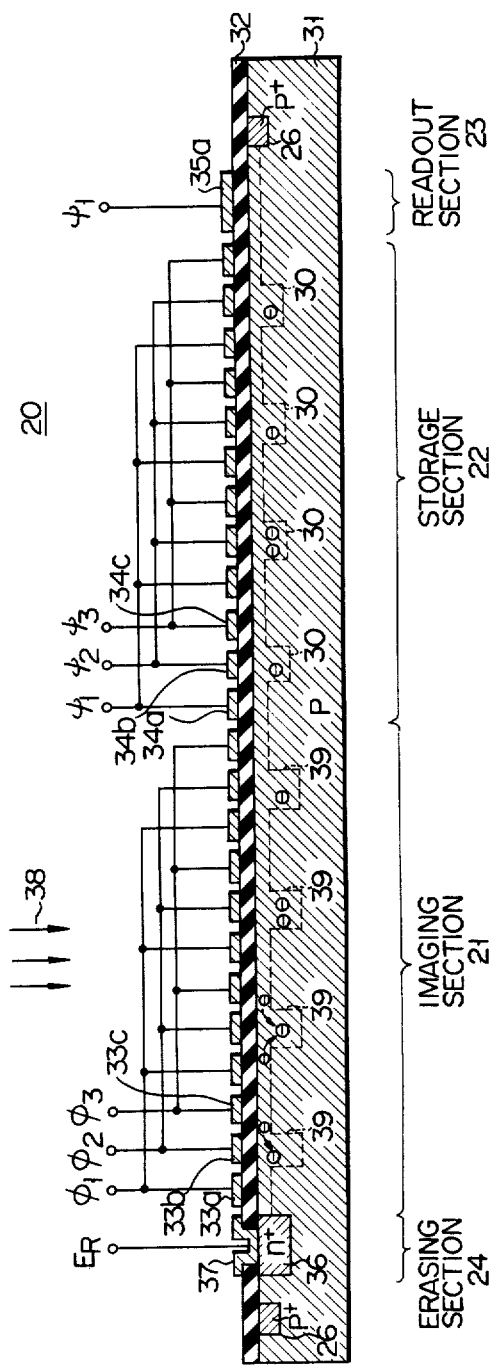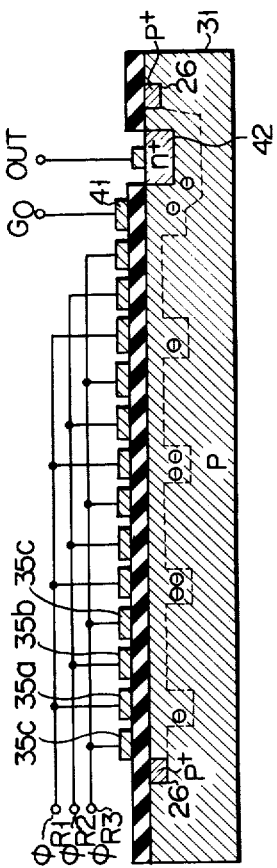

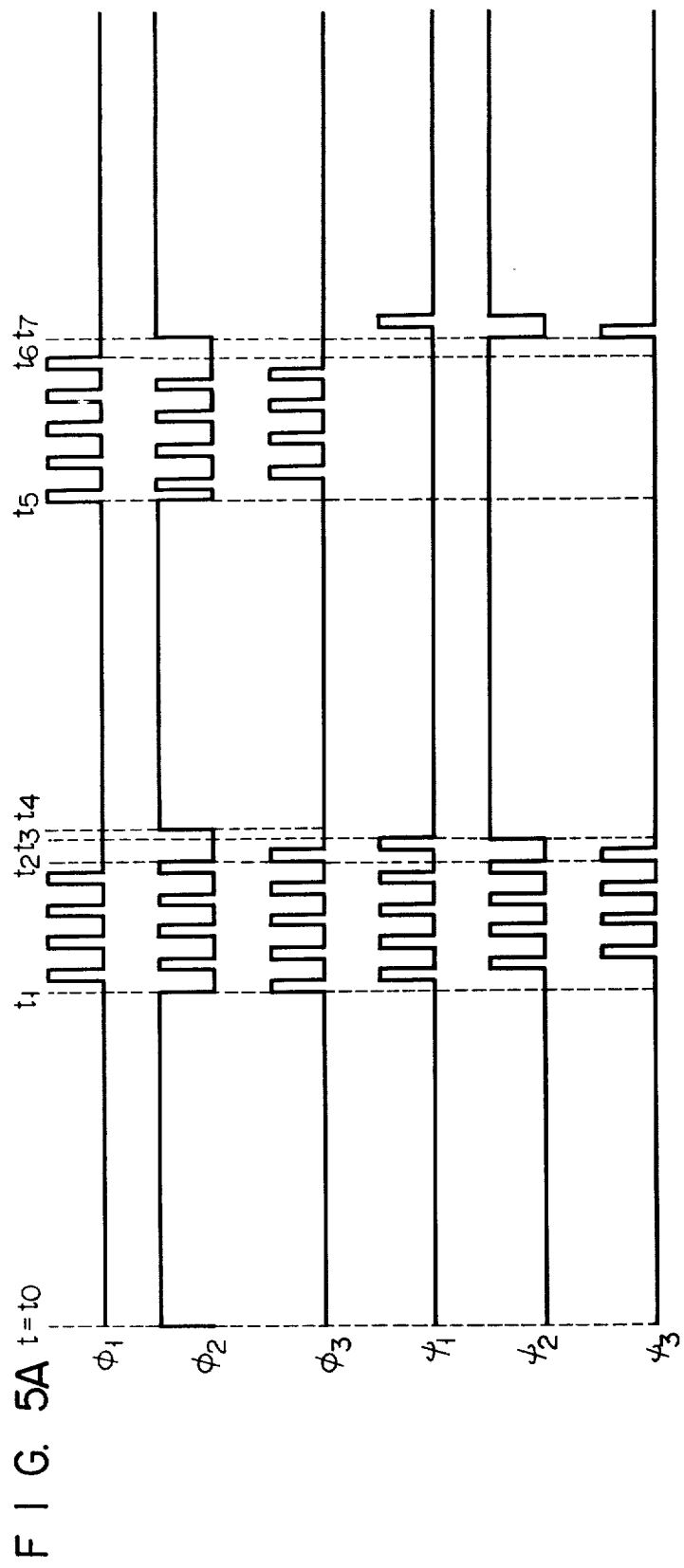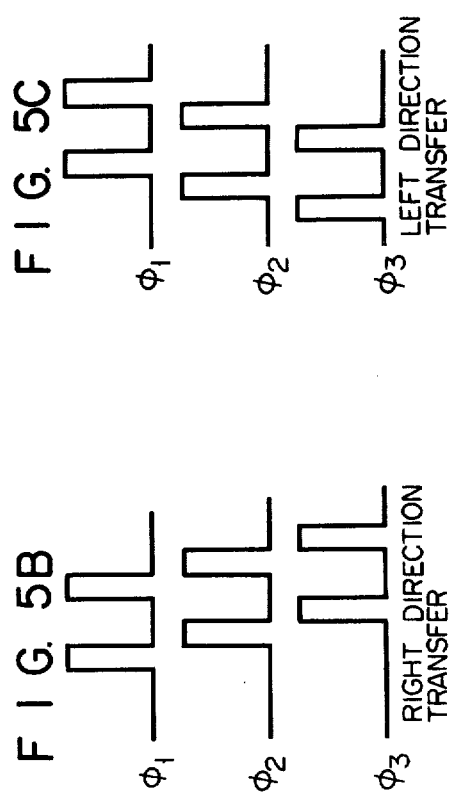

SOLID STATE IMAGE PICKUP DEVICE

This is a continuation, of application Ser. No. 753,858 filed Dec. 23, 1976, now abandoned.

BACKGROUND OF THE INVENTION

This invention relates to a solid state image pickup device and in particular an image pickup device suitable for narrow band transmission which uses a charge transfer device.

In a video telephone, for example, a slow scan type image pickup tube and image pickable storage tube are used in an image pickup device to transmit in narrow band width a picture image which is obtained in a standard television system. Since, however, the image pickup tube and storage tube are constructed of vacuum tubes the associated device is made bulky and requires electric power of a heater. Furthermore, they are unstable and disadvantageous from the standpoint of reliability as well as a life service.

To improve such disadvantages a solid state image pickup device 10 in FIG. 1 is considered comprising an imaging section 11, storage section 12 and readout section 13 using a charge transfer element. In this image pickup device 10 an electric charge corresponding to a quantity of light of a projected optical image is produced for a required imaging time t in a standard television system a time corresponding to substantially one frame time (1/30 second) in the imaging section. The electric charge is transferred to the storage section 12 where a line of electric charge is positioned, and each line of electric charge is transferred from the right end of the storage section 12 to the readout section 13 and outputted as a video signal from an output electrode in the readout section. Such a readout operation is sequentially repeated, thus completing the transfer of a one frame picture image consisting of electric charge transferred from the storage section 12.

When the electric charge stored in the storage section 12 begins to be read out as a video signal from the readout section 13, an electric charge corresponding to the next frame begins to be created in the imaging section 11. In consequence, the imaging time must coincide with the readout time in which all the electric charge stored in the storage section is read out as a video signal. That is, this time must coincide with a one frame time (1/30 second) in the standard TV system. However, the readout operation should be effected at low speed to transmit a picture image in narrow band width. In this case there is required a long readout time of about 1 to 10 seconds. In the conventional charge transfer element it is impossible to retain electric charge in the storage section for such a long time. If an imaging operation is effected over a long time, it is impossible to provide a practical device, since a moving subject prominently impairs a picture image quality due to the overlap of picture images.

In a solid state image pickup device using a charge coupled device, as disclosed and claimed in U.S. Pat. No. 3,777,061, desired optical information is obtained by distributing an electric charge on an imaging section to the left and right of a storage section. However, this device can not be applied to narrow band transmission, because the imaging time coincides with the readout time and an electric charge created at the imaging section can not be stored for a long time.

SUMMARY OF THE INVENTION

An object of this invention is to provide a compact, lightweight solid-state image pickup device which is high in reliability, low in power dissipation and capable of narrow band transmission.

Another object of this invention is to provide a solid state image pickup device which can store an electric charge corresponding to a projected optical image for a relatively long time and output a video signal without impairing picture image quality.

Another object of this invention is to provide a solid stage image pickup device suitable for narrow band transmission, which can read out a required portion of electric charge and erase an unrequired portion of the electric charge.

Another object of this invention is to provide a solid-state image pickup device having a storage section and readout section which can be driven by a low frequency drive pulse.

According to this invention there is provided a solid state image pickup device utilizing a charge transfer device, comprising an imaging section for producing an electric charge corresponding to an optical image projected, a storage section for storing the electric charge transferred from the imaging section, a readout section located on one side of the storage section to read out a required electric charge from the storage section, drive means for transferring the electric charge at the imaging section, storage section and readout section.

Since according to this invention an unrequired portion of electric charge produced in the imaging section is erased and only a required portion of the electric charge can be stored in the storage section for substantially a long time in comparison with an imaging time involved in the imaging section. In consequence, the readout of electric charge from the storage section can be effected at slow speed over a relatively long time and this invention can be applied to narrow band transmission.

BRIEF DESCRIPTION OF THE DRAWINGS

This invention will now be described by way of example by referring to the accompanying drawings in which:

FIG. 2 is a diagrammatic view showing a solid state image pickup device according to one embodiment of this invention;

FIG. 3 is an enlarged, cross-sectional view as taken along line 3—3 in FIG. 2;

FIG. 4 is an enlarged, cross-sectional view as taken along line 4—4 in FIG. 2;

FIG. 5A is a time chart of drive pulses for explaining the operation of the solid state image pickup device of this invention;

FIG. 5B is an enlarged view of drive pulse ($\phi_1$, $\phi_2$, $\phi_3$) which are present between $t_1$ and $t_2$ of FIG. 5A;

FIG. 5C is an enlarged view of drive pulses ($\phi_1$, $\phi_2$, $\phi_3$) which are present between $t_5$ and $t_6$ of FIG. 5A;

FIG. 6 is a view showing a solid state image pickup device according to another embodiment of this invention;

FIG. 7B is a cross sectional view taken along line B—B in

FIG 7A;

Referring to FIGS. 2, 3 and 4 conjointly, a solid state image pickup device includes an imaging section 1 for converting a projected optical image to electric charge and transferring it, a storage section 22 for storing a necessary portion of the electric charge from the imaging section 21 for a relatively long time and transferring it, a readout section 23 for generating a video signal corresponding to the electric charge transferred from the storage section, and an erasing section 24 for erasing an unnecessary portion of electric charge which is converted at the imaging section, but not transferred to the storage section. The image pickup device also includes a drive pulse means 25 for generating pulses $\phi_1$, $\phi_2$, $\phi_3$, $\psi_1$, $\psi_2$, $\psi_3$ and $\phi_{R1}$, $\phi_{R2}$, $\phi_{R3}$ so as to drive the imaging section 21, storage section 22 and readout section 23 in 3-phase fashion. The imaging section 21, storage section 22, and readout section 23 utilizing a charge coupled device (CCD) are comprised of a plurality of metal insulator semiconductor (MIS) capacitors comprising a common semiconductor substrate 31 of, for example, P-type conductivity, an insulating layer 32 formed on the substrate 31 by thermal oxidation, insulator silicon (MIS) and imaging section electrodes 33a, 33b, 33c, storage section electrodes 34a, 34b, 34c and readout electrodes 35a, 35b, 35c which are 3-phase driven by the drive pulses $\phi_1$, $\phi_2$, $\phi_3$, $\psi_1$, $\psi_2$, $\psi_3$ and $\phi_{R1}$, $\phi_{R2}$, $\phi_{R3}$. The readout section 23 has at one end an output gate electrode 41 formed on the insulating layer 32 and adapted to receive a voltage from a terminal $G_O$, and an output diode formed by diffusing an n-type impurity in the substrate 31 and connected to a video output terminal OUT. The erasing section 24 is located at a side opposite to that on which the imaging section 21 and storage section 22 are positioned. The erasing section 24 has an erasing drain 36 formed by diffusing an n-type impurity in the substrate 31 and an erasing electrode 37 connected to the erasing drain 36 and adapted to receive voltage from a terminal $E_R$. A channel stop layer 26 comprised of a p+ layer formed by diffusing a P-type impurity in predetermined places in the substrate is located so that electric charge in the imaging section 21, storage section 22 and readout section 23 is not diffused during storage or transfer.

Figure 1:
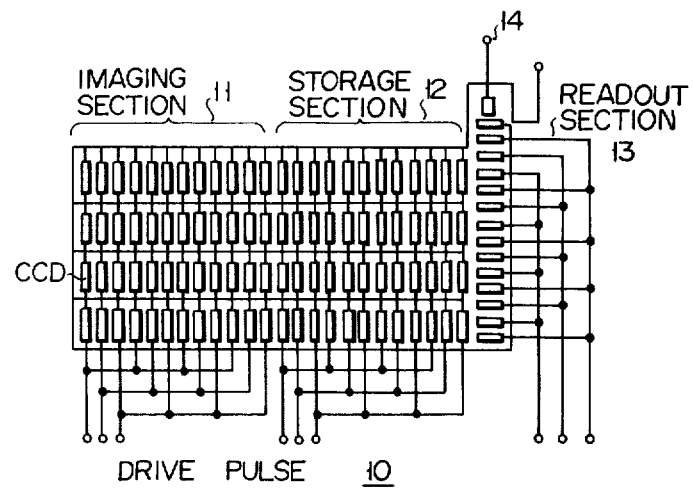
FIG. 1 is a diagrammatic view showing a conventional solid state image pickup device using a charge transfer element.

The substrate 31 is subjected to a treatment for decreasing a trap level operating as generation-recombination center during transfer or storage. That is, after formation of the insulating layer 32 on the substrate 31 the resultant semiconductor structure is annealed for about 30 minutes at 400° C. in a dried hydrogen ($H_2$) atmosphere to decrease an interface trap present in the neighborhood of an interface between the substrate and the insulating layer 32. By so doing, the storage section 22 of the solid state image pickup device 20 according to this invention can store electric charge for a relatively long period of 1 to 10 seconds and in consequence it is not necessary to refresh a stored electric charge. Another method for decreasing an interface trap is by annealing the substrate 31 for about 30 minutes at 1000° to 1100° C. in a dried nitrogen ($N_2$) atmosphere after the insulating layer 32 is formed on the substrate. As the trap level, there is, in addition to the interface trap, a bulk trap such as a lattice defect etc. In order to decrease the bulk trap an effective method is by treating, or gettering, the rear surface of a substrate wafer.

The operation of the image pickup device 20 will now be described by referring to FIGS. 3, 4 and 5.

An electric charge (or an electron in the case of a P-type substrate) created by an optical image 38, which is projected onto the imaging section 21 within an imaging time of $t = t_0$ to $t = t_1$, is collected in potential wells 39 formed below the electrodes 33b to which a pulse $\phi_2$ is applied. An electric charge created at the imaging section 21 during a transfer time of $t = t_1$ to $t = t_2$ is transferred from the imaging section electrodes 33a, 33b, 33c to which pulses $\phi_1$, $\phi_2$, $\phi_3$ are applied, to the storage section electrodes 34a, 34b, 34c to which $\psi_1$, $\psi_2$, $\psi_3$ are applied. The electric charge is finally stored in potential wells 30 formed below the storage section electrodes 34b. In this way, the formation and storage of one picture image are completed. This time substantially corresponds to a one frame time (1/30 seconds) for a standard television system. The charge of the one-frame picture image, i.e., the image stored below the electrode 34b of the storage section 22 is transferred at a low rate of speed (about one second) from the storage section 22 to the readout section 23, and outputted as a video signal from the output terminal OUT of the output diode 42 at the readout section 23 operating as shift-register (time-chart of driving pulses $\phi_{R1}$, $\phi_{R2}$ and $\phi_{R3}$ is not shown). Since the video signal is outputted at a low scanning speed, the band width of the signal is made narrow and the signal is suitable for a video telephone which requires narrow band transmission.

Since, on the other hand, electric charge created at the imaging section 21 while the image of a first frame is outputted at low speed becomes unnecessary, it is transferred to the erasing section 24 for erasure. That is, a picture image corresponding to a second frame is projected at the imaging section at imaging time of $t = t_4$ to $t = t_5$. However, the electric charge corresponding to the picture image is unnecessary and is transferred at time of $t_5$ to $t_6$ to the erasing section 24 on the side opposite to that on which the electric charge corresponding to the first frame picture image is stored. The time-chart for these drive pulses applied to the imaging section electrodes during time of $t_1$ to $t_2$ and $t_5$ to $t_6$ is shown in FIGS. 5B and 5C respectively. The electric charge is transferred in a potential well below the electrode 33a in that area of the imaging section 21 which is adjacent to the erasing section 24 and absorbed toward the erase drain 36 to which a positive voltage is applied through the terminal $E_R$. An electric charge corresponding to a third frame image picture, which is created at time from $t_7$ is also transferred to the erasing section 24 for erasure.

In this way, only the required electric charge corresponding to the optical image is transferred to the storage section and it is outputted as a video signal at a low scanning speed over a relatively long time of 1 to 10 seconds and the unrequired electric charge corresponding to the image, which is created during the low speed scanning, is transferred to the erasing section for erasure. Therefore, the present solid state image picup device is suitable for narrow band transmission.

A solid state image pickup device according to another embodiment of this invention will be described below.

Referring to FIG. 6 an erasing section 61 is located between an imaging section 21 and a storage section 22. The other arrangement is substantially the same as in the first embodiment. The erasing section 61 transfers only a required electric charge to the storage section 22 and erases an unrequired electric charge. In this case, the electric charge at the imaging section 21 is transferred only in one direction and the transfer of the electric charge is effected by a pulse drive means. From this it will be understood that CCD having a one-direction property may be used in the imaging section 21.

Figure 7A:
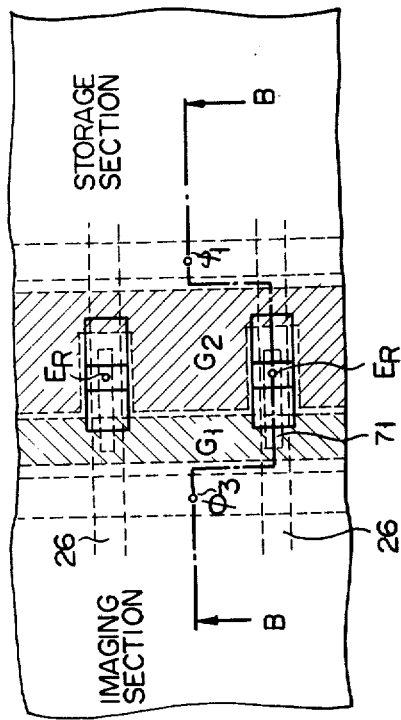
FIG. 7A is an enlarged plan view partly showing the major portion of an erasing section in FIG. 6
Figure 7B:
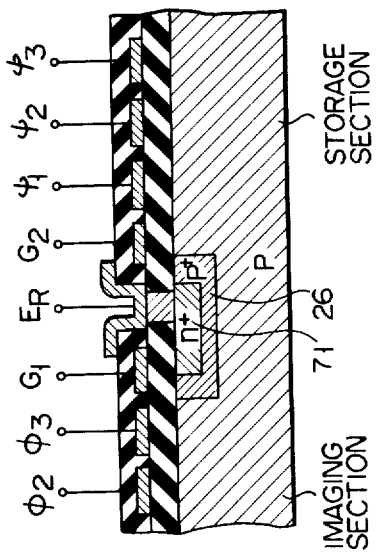

FIGS. 7A and 7B show the major portion of the erasing section 61 and its arrangement. In FIGS. 7A and 7B, imaging section electrodes and storage section electrodes to which drive pulses $\phi_1$, $\phi_2$, $\phi_3$ and $\psi_1$, $\psi_2$, $\psi_3$ are applied, respectively, are formed on a $SiO_2$ insulating layer 32 depositing on a P-type semiconductor substrate 31. Gate electrodes $G_1$ and $G_2$ to which applied with a control voltage for transferring electric charge from the imaging section 21 to the storage section 22 are arranged one on the side of the imaging section 21 and one on the side of the storage section 22. The gate electrode $G_2$ has finger portion 73 being located in proximity to the gate electrode $G_1$. A drain region 71 is formed in the substrate between the gate electrodes $G_1$ and $G_2$ by diffusing an n-type impurity through the window of the insulating layer 32. Furthermore, a $Si_3N_4$ or $SiO_2$ insulating layer 72 is deposited on the imaging electrodes 33a, 33b, 33c, storage electrodes 34a, 34b, 34c and gate electrodes $G_1$, $G_2$ remaining the window corresponding to the window of the insulating layer 32. A erasing electrode $E_R$ deposited on the insulating layer 72 is in contact with the drain region 71 through the window of the insulation layers 32 and 72. A erasing section is comprised of the gate electrode $G_1$ and $G_2$, the drain region 71 and the erasing electrode $E_R$. A p+ channel stop layer 26 is positioned between each line.

Where only a required electric charge corresponding to a one-frame picture image on the imaging section 21 is to be transmitted through the storage section 22 that is, no corresponding electric charge is not to be deleted, a negative voltage is applied to the erasing electrode $E_R$ and positive voltage to the gate electrodes $G_1$ and $G_2$. The electric charge stored in that potential well below the gate electrode $G_1$ which is provided in the P-type substrate is passed through a neighboring area of the electrodes $G_1$ and $G_2$, i.e., through a finger portion 73, without being absorbed at the n+ drain region 71 to which a negative voltage is applied, and moved into that potential well below the gate electrode which is provided in the P-type substrate. In consequence, the electric charge on the imaging section is stored in the storage section without being erased.

Where unrequired electric charges on the imaging section corresponding to 29 frames are to be deleted, a positve voltage is applied to the gate electrode $G_1$ and a negative voltage to the gate electrode $G_2$. In this case, electric charge stored in that potential well below the gate electrode $G_1$ (on the imaging section) which is provided in the P-type substrate is absorbed in the n+ drain region to which a positive voltage is applied, and erased. That is, the unrequired electric charge created at the imaging section is erased at the erasing section 6 without being transferred to the storage section.

Figure 8A:
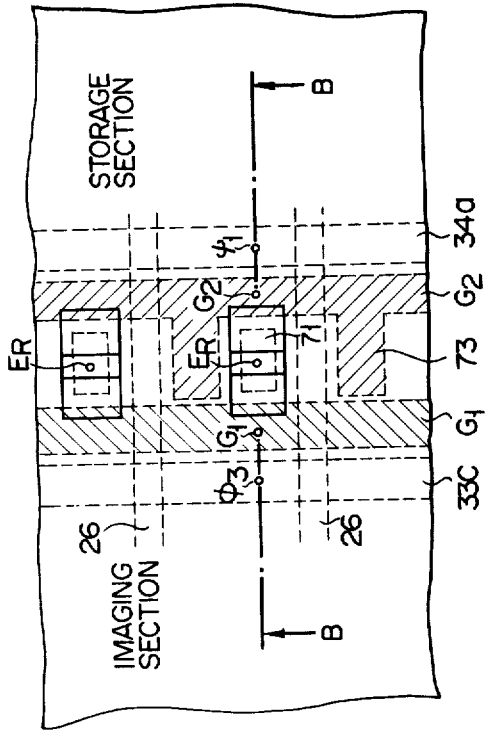
FIG. 8A is an enlarged plan view partly showing a modified form of erasing section and FIG. 8B is cross-sectional view taken along line B—B in FIG. 8A.
Figure 8B:
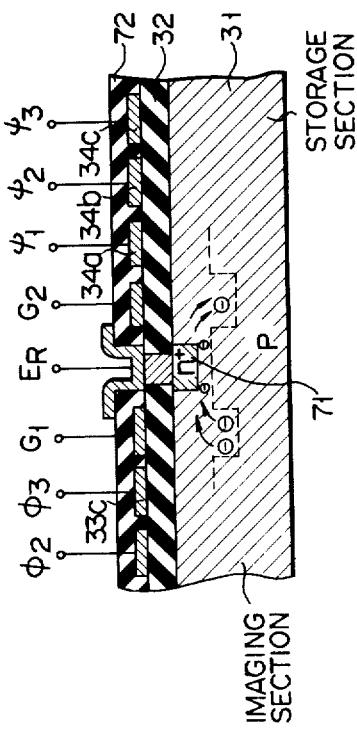

The erasing section 61 in FIG. 6 can be so formed as to have a configuration shown in FIGS. 8A and 8B. FIG. 8A shows a major portion of an erasing section and FIG. 8B is a cross-section as taken line B—B in FIG. 8A. The erasing section in FIGS. 8A and 8B is different from that in FIGS. 7A and 7B in that a n+ drain region 81 is formed in a p+ channel stop region 26.

When out of an electric charge created by an optical image on the imaging section only a required portion corresponding to one frame to be transferred to the storage section 22, i.e., a corresponding electric charge is not to be erased, a negative voltage is applied to the erasING electrode ER and a positive voltage is applied to the gate electrodes $G_1$ and $G_2$. In this case, electric charge stored in a potential well of the gate electrodes $G_1$ and $G_2$ and moved into a potential well below the gate electrode $G_2$.

When unrequired electric charges on the imaging section 21 corresponding to 29 frames are to be erased, a positive voltage is applied to the gate electrode $G_1$, a negative voltage to the gate electrode $G_2$, and a positive voltage to the erasing electrode ER. In this case, electric charge in the potential well below the gate electrode $G_1$ is repelled from the gate electrode $G_2$ and only that electric charge moved beyond a potential barrier constituted of a channel stopper layer 26 is attracted toward the n+ drain region 81 and erased there. When in this erasing section an unrequired electric charge corresponding to a 30th frame is erased, however, it is necessary that the electric charge which remains in the potential well below the gate electrode $G_1$ without being moved beyond the potential barrier be transferred through the gate electrode $G_2$ toward the storage section and erased during the blanking time period.

Figure 9:
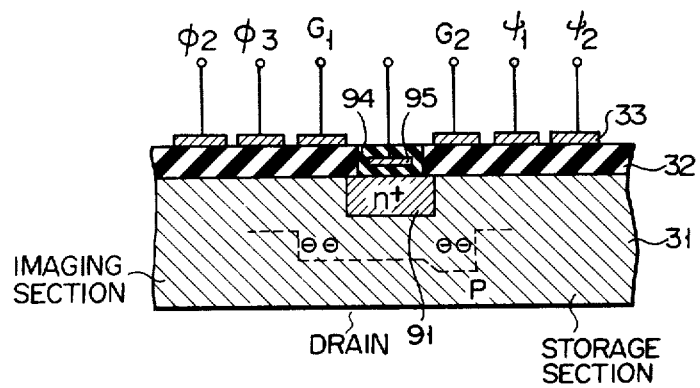
FIG. 9 is an enlarged cross-sectional view showing another form of erasing section, taken along line 9—9 in FIG. 6.

The erasing section 61 in FIG. 6 can be constructed using a gate 95 in FIG. 9 instead of the erasing electrode ER. In this erasing section, pulse drive electrodes $\phi_1$, $\phi_2$, $\phi_3$ and $\psi_1$, $\psi_2$, $\psi_3$ and gate electrodes $G_1$ and $G_2$ are formed on a $SiO_2$ insulating layer 32 depositing on a P-type substrate 31, drain region 91 is formed in the substrate 31 by diffusing the n type impurity through a window provided in that area of the $SiO_2$ insulating layer 32 which is located between the gate electrodes $G_1$ and $G_2$. As a result, an n+ drain region 91 is formed. The window is covered with a $SiO_2$ film 94 and a floating gate 95 made of a polycrystalline silicon (poly-Si) is formed in the $SiO_2$ film 94. Where out of electric charge created on the imaging section a required portion corresponding to one frame is to be transferred to the storage section, positive voltages $VG_1$ and $VG_2$ ($VG_1 < VG_2$) are applied to the gate electrodes $G_1$ and $G_2$ and the gate 95 is opened.

The electric charge on the imaging section which is stored in the potential well in the P-type substrate is passed through the n+ drain region 91 of the erasing section and stored in that potential well below the gate electrode $G_2$ which is formed in the P-type substrate in the storage section. As a result, an electric charge corresponding to an optical image on the imaging section is transferred to the storage section.

Where out of electric charge created on the imaging section unrequired electric charges corresponding to 29 frames are to be deleted, a positive voltage is applied to the gate electrode $G_1$, a negative voltage to the gate electrode $G_2$ and a positive voltage to the gate 95. In this case, electric charge on the imaging section which is stored in the potential well is attracted toward the n+ region 91, further moved beyond the n+ region 91 into a barrier, constituted of the SiO₂ insulating layer 94, due to avalanche and reaches the gate 95 where it is erased. In consequence, the unrequired electric charge on the imaging section is erased without being transferred.

Figure 10:
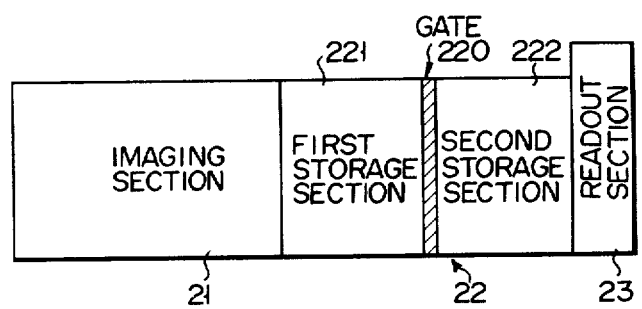
FIG. 10 is a diagrammatic view showing a solid state image pickup device according to another embodiment of this invention.

FIG. 10 shows a solid state image pickup device according to third embodiment of this invention. The image pickup device includes CCD having a one-direction property and comprises an imaging section 21; a storage section 22 having a first storage section 221 for erasing a second storage section 22 for transferring and a gate 223 located between the first and second storage sections 222 and 223; readout section 23; and a drive means for transferring electric charge not shown. When an electric charge corresponding to a desired optical image is to be read out from the storage section 22, only an electric charge corresponding to one frame, which is created on the imaging section 21, is transferred to the storage section 22 and the gate 223 is opened for transferring the electric charge to the second storage section 222. The electric charge corresponding to one frame is read out at a slow scanning speed from the storage section 222. Unrequired electric charges corresponding to 29 frames, which are created on the imaging section, are transferred at a high scanning speed to the first storage section 221 for storage. Since at this time the gate 223 is closed, the unrequired electric charges are sequentially stored in the first storage section. After the electric charge corresponding to a specific one frame is transferred at slow scanning speed from the second storage section 223 to the readout section 23, the unrequired electric charge stored in the first storage section 221 is transferred through now opened gate 223 to the second storage section 222 and it is read out from the readout section 23. Since in this case unrequired electric charges stored in the first storage section during the readout time period are overlapped, when unrequired electric charge corresponding to 29 frames are overlapped, a readout picture image is substantially at a white level. This means that the same effect as deleting unrequired electric charge is obtained in the image pickup device in FIG. 10.

Since in the above-mentioned embodiments an electric charge corresponding to a subject which is substantially standstill during a 1/30, or less, second per frame time period can be read out at slow scanning speed, this invention can be applied to narrow band transmission as in telephone lines etc. Accordingly, this invention provides a practical image pickup device capable of producing an excellent picture image due to other than that required portion of electric charge corresponding to a picture image being erased.

Figure 11:
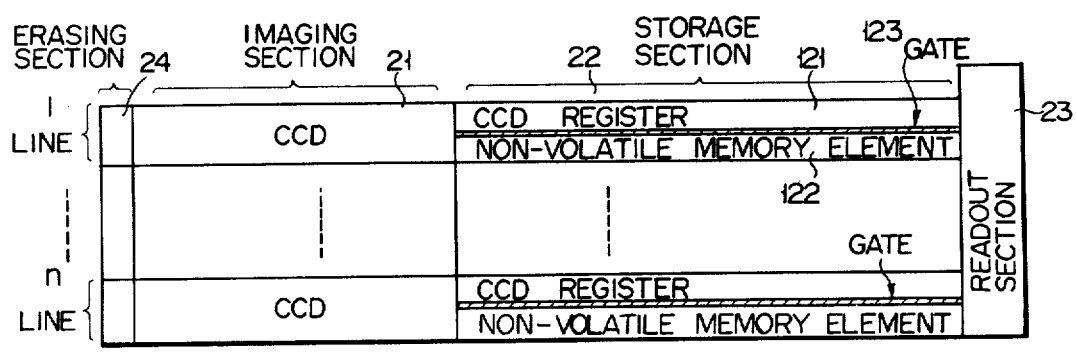
FIG. 11 is a diagrammatic view showing an applied solid state image pickup device using a composite storage section.

FIG. 11 shows an application of the solid state image pickup device. In this arrangement a storage section 22 is constructed of a composite storage section comprising a CCD register 121, nonvolatile memory element 122, and gate 123 located between the CCD register 121 and the nonvolatile memory element 122. Take a line 1 by way of example. An electric charge corresponding to a picture image, which is created at CCD of an imaging section 21, is stored in the CCD register 121 of the storage section 22. Thereafter, the gate 123 is opened to permit the corresponding electric charge to be stored in the nonvolatile memory 122. After a required time period the gate 123 is again opened to permit the electric charge to be shifted to the CCD register 121 and the electric charge is read out at slow speed from the readout section 23. This permits electric charge to be stored for a long time (several minutes). Although in FIGS. 7, 10 and 11 a pulse drive means for transferring electric charge is not shown, it is constructed in the same way as in the embodiment in FIG. 2 when an unrequired electric charge is to be erased, it is only necessary that it be transferred, like the embodiment in, FIG. 2, to the erasing section 24 provided on the side opposite to that on which the imaging section is located.

What is claimed is:

1. A solid state charge transfer image pickup device suitable for narrow band transmission, comprising:

an imaging section for converting projected optical images to electric charges, each conversion occurring within one-frame time;

a storage section for storing the electric charges of a selected one-frame image for a storage time which is longer than the one-frame time;

a readout section located on one side of the storage section to read out the electric charges from the storage section within the storage time;

an erasing means for erasing electric charges of unrequired frame images produced at the imaging section during the storage time, said erasing means comprising a drain provided between the imaging and storage sections formed by diffusing an impurity having a first conductivity type in a semiconductor substrate area having a second conductivity type, an erasing electrode electro-conductively connected to the drain, a first gate electrode provided on an insulating layer deposited on the imaging section and a second gate electrode provided on the insulating layer deposited on the storage section in which the electric charges of the unrequired images produced at the imaging section are erased by controlling a voltage applied to said electrodes; and a drive means for transferring the electric charges of the required frame images to the erasing means from the imaging section and the electric charge of the selected frame image to the storage section from the imaging section through the erasing means.

2. A solid state charge transfer image pickup apparatus for narrow transmission comprising:

an imaging section for converting optical images to electric charges, each conversion occurring within one-frame time;

a storage section for storing the electrical charges of a selected frame image for a storage time which is longer than one-frame time;

a readout section located on one side of the storage section for reading out the electrical charges from the storage section within the storage time;

an erasing means provided between the imaging and storage sections for erasing electric charges of unrequired frame images produced at the imaging section during the storage time, said erasing means comprising a first impurity region formed by diffusing an impurity having a first conductivity type in a semiconductor substrate area having said first conductivity type, a drain provided between the imaging section and the storage section comprising a second impurity region formed by diffusing an impurity having a second conductivity type in the first impurity region, an erasing electrode electro-conductively coupled to the drain, a first gate electrode provided on an insulating layer deposited on the imaging section, and a second gate electrode provided on the insulating layer deposited on the storage section; and a drive means for transferring the electric charges of the unrequired frame images to the erasing means from the imaging section and the electric charge of the selected frame image to the storage section from the imaging section through the erasing means.

3. A solid state charge transfer image pickup apparatus for narrow transmission comprising:

an imaging section for converting optical images to electric charges, each conversion occurring within one-frame time;

a storage section for storing the electrical charges of a selected frame image for a storage time which is longer than one-frame time;

a readout section located on one side of the storage section for reading out the electrical charges from the storage section within the storage time;

an erasing means provided between the imaging and storage sections for erasing electric charges of unrequired frame images produced at the imaging section during the storage time, said erasing means including a first gate electrode provided on an insulating layer deposited on the imaging section, a second gate electrode provided on the insulating layer deposited on the storage section, a drain provided between the imaging section and the storage section comprising an electroconductive impurity region formed by diffusing an impurity having a first conductivity type in a semoconductive substrate having a second conductivity type, and a third gate electrode provided in the insulating layer on the drain, through which the electric charges of the unrequired images transferred from the imaging section overflow outside the device; and a drive means for transferring the electric charges of the unrequired frame images to the erasing means from the imaging section and the electric charge of the selected frame image to the storage section from the imaging section through the erasing means.

4. A solid-state image pickup device utilizing a charge transfer device, in which electrical image signals corresponding to one optical image defining one frame are transferred during each of a plurality of predetermined transfer times divided into n equal time segments each time segment consisting of an accumulation time for accumulating electrical charges and a segment transfer time for transferring the electrical charges, each such predetermined transfer time being sufficient for narrow band transmission, comprising:

an imaging section comprising a row and column array of photosensing and storage elements for storing electrical charges, said imaging section for producing one electrical charge pattern corresponding to electrical charges stored in the elements during each of said n equal time segments into which said predetermined transfer time is divided, the time segment being sufficient to convert the light corresponding to the optical image into the electrical charges and accumulate the charges in said imaging section, n number of electrical charge patterns being produced during said predetermined transfer time;

a first storage section including a plurality of elements, said section connected to one end of said imaging section and constructed of a row and column array of storage elements for storing electrical charges;

a second storage section including a plurality of elements, and comprising a row and column array of storage elements for storing electrical charges, said second storage section being capable of storing at least the last row of the electrical charges of one electrical charge pattern during said predetermined transfer time;

gate means coupling said first storage section to said second storage section for selectively transferring electrical charges from said first storage section to said second storage section;

a readout section connected to said second storage section for reading out electrical charges row by row so that one electrical charge pattern can be read out during said predetermined transfer time; and drive means for maintaining said gate means closed during a time period up to a $(n-1)$th time segment of said predetermined transfer time so that $(n-1)$ electrical charge patterns produced at said imaging section are continuously transferred from said imaging section to said first storage section but prevented from being transferred to said second storage section and for maintaining said gate opened during an n-th time segment of said predetermined transfer time so that an n-th electrical charge pattern produced at said imaging section is transferred from said imaging section is transferred from said imaging section through said first storage section and gate means to said second storage section for being read out during the next predetermined transfer time.

* * * * *